(12) United States Patent
Kim et al.

(10) Patent No.: US 9,214,944 B2
(45) Date of Patent: Dec. 15, 2015

(54) DIGITAL COUNTER

(71) Applicants: SK hynix Inc., Icheon-si, Gyeonggi-do (KR); Industry-University Cooperation Foundation, Hanyang University, Seoul (KR)

(72) Inventors: Sung Mook Kim, Icheon-si (KR); Byong Deok Choi, Seoul (KR); Jong Seok Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/018,513

(22) Filed: Sep. 5, 2013

(65) Prior Publication Data

US 2014/0341332 A1 Nov. 20, 2014

(30) Foreign Application Priority Data

May 20, 2013 (KR) .................. 10-2013-0056417

(51) Int. Cl.
*H03B 19/00* (2006.01)
*H03K 21/38* (2006.01)
*H03K 21/02* (2006.01)

(52) U.S. Cl.
CPC .............. *H03K 21/38* (2013.01); *H03K 21/023* (2013.01)

(58) Field of Classification Search
USPC ......... 327/115, 116, 117, 118, 355–361, 202, 327/203, 208–212, 218; 377/47, 48; 455/4
See application file for complete search history.

(56) References Cited

U.S. PATENT DOCUMENTS

| | | | | |
|---|---|---|---|---|
| 5,029,191 A * | 7/1991 | Robbins | 377/110 |
| 5,389,826 A * | 2/1995 | Sonobe | 307/125 |
| 5,530,387 A * | 6/1996 | Kim | 327/119 |
| 6,346,833 B1 * | 2/2002 | Kuroki | 327/119 |
| 6,351,170 B1 * | 2/2002 | Takahashi et al. | 327/218 |
| 6,404,839 B1 * | 6/2002 | Fong et al. | 377/47 |
| 6,445,760 B1 * | 9/2002 | Weintraub et al. | 377/48 |
| 6,937,082 B2 * | 8/2005 | Ishimi | 327/291 |
| 7,005,898 B2 * | 2/2006 | Tam et al. | 327/115 |
| 7,391,250 B1 * | 6/2008 | Chuang | 327/211 |
| 2005/0212570 A1 * | 9/2005 | Sun et al. | 327/115 |
| 2008/0186062 A1 * | 8/2008 | Dekate et al. | 327/117 |
| 2009/0212833 A1 * | 8/2009 | Mitsuishi | 327/115 |
| 2010/0127742 A1 * | 5/2010 | Chen | 327/156 |
| 2010/0225796 A1 | 9/2010 | Lim et al. | |
| 2011/0006816 A1 * | 1/2011 | Bazes | 327/117 |

FOREIGN PATENT DOCUMENTS

KR 1020100092542 A 8/2010
KR 1020110033583 A 3/2011

* cited by examiner

*Primary Examiner* — Brandon S Cole
(74) *Attorney, Agent, or Firm* — William Park & Associates Ltd.

(57) ABSTRACT

A digital counter includes: a plurality of flip-flops configured to generate a plurality of count signals; and a controller configured to prevent level transition of an input terminal of a flip-flop to generate a count signal corresponding to a least significant bit (LSB), in response to a clock signal and a count end signal.

22 Claims, 7 Drawing Sheets

FIG.9

| | DFF0 | | DFF1 | | DFF2 | | DFF3 | | DFF4 | | DFF5 | | DFF6 | | DFF7 | | DFF8 | | DFF9 | | Total Toggling | Power |
|---|---|---|---|---|---|---|---|---|---|---|---|---|---|---|---|---|---|---|---|---|---|---|
| | LT1 | LT2 | LT1 | LT2 | LT1 | LT2 | LT1 | LT2 | LT1 | LT2 | LT1 | LT2 | LT1 | LT2 | LT1 | LT2 | LT1 | LT2 | LT1 | LT2 | | |
| 10-Bit Counter (FIG.1) | 513 | 512 | 257 | 256 | 129 | 128 | 65 | 64 | 33 | 32 | 17 | 16 | 9 | 8 | 5 | 4 | 3 | 2 | 2 | 1 | 2056 | 100% |
| 10-Bit Counter (FIG.4) | 512 | 1 | 257 | 256 | 129 | 128 | 65 | 64 | 33 | 32 | 17 | 16 | 9 | 8 | 5 | 4 | 3 | 2 | 2 | 1 | 1544 | 75.1% |
| 10-Bit Counter (FIG.7) | 1 | 1 | 257 | 256 | 129 | 128 | 65 | 64 | 33 | 32 | 17 | 16 | 9 | 8 | 5 | 4 | 3 | 2 | 2 | 1 | 1033 | 50.2% |

DIGITAL COUNTER

CROSS-REFERENCES TO RELATED APPLICATION

The present application claims priority under 35 U.S.C. §119(a) to Korean application number 10-2013-0056417, filed on May 20, 2013, in the Korean Intellectual Property Office, which is incorporated herein by reference in its entirety.

BACKGROUND

1. Technical Field

Various embodiments relate to a semiconductor circuit, and more particularly, to a digital counter.

2. Related Art

A digital counter is used in various technical fields. For example, the digital counter may be used in a sensing circuit for correlated double sampling (CDS) to improve the uniformity of CMOS image sensors.

At this time, CDS may be divided into analog CDS and digital CDS (DDS). Since the DDS has higher speed and precision than the analog CDS, the DDS is more frequently used.

However, the DDS requires a digital counter for each channel. For example, when a 10-bit sensing circuit is constructed, 10 digital counters are used for each channel, and several thousand digital counters are used as a whole.

When such a large number of digital counters are used for the DDS, power consumption inevitably increases. Thus, the power consumption of the digital counters needs to be reduced.

FIG. 1 is a circuit diagram of a conventional digital counter 10.

An N-bit digital counter may include N flip-flops. FIG. 1 illustrates a conventional four-bit digital counter, and the four-bit digital counter includes first to fourth flip-flops DFF0 to DFF3.

Each of the first to fourth flip-flops DFF0 to DFF3 has an inverting output terminal Qb coupled to an input terminal D thereof.

The first flip-flop DFF0 has a clock terminal configured to receive a clock signal CLK.

Each of the second to fourth flip-flops DFF1 to DFF3 have a clock terminal coupled to the inverting output terminal Qb of the previous flip-flop.

The first to fourth flip-flops DFF0 to DFF3 output signals of the respective output terminals Q as count signals D<0:3>.

FIG. 2 is a circuit diagram illustrating the internal configuration of the first flip-flop DFF0 of FIG. 1.

Referring to FIG. 2, the first flip-flop DFF0 includes a first latch LT1 and a second latch LT2.

The first latch LT1 is configured to latch a signal inputted through the input terminal D, maintain a node N1 to the level of the signal inputted through the input terminal D, and include a plurality of transmission gates and a plurality of inverters.

The second latch LT2 is configured to latch the level of the node N1, maintain the levels of the output terminal Q and the inverting output terminal Qb, and include a plurality of transmission gates and a plurality of inverters.

At this time, the second to fourth flip-flops DFF1 to DFF3 are configured in the same manner as the first flip-flop DFF0.

FIG. 3 is an operation timing diagram of FIG. 1.

Referring to FIG. 3, the first and second latches LT1 and LT2 of the first to fourth flip-flops DFF0 to DFF3 in the conventional digital counter 10 are sequentially operated according to the clock signal CLK, thereby increasing the logic values of the count signals D<0:3>.

While the conventional digital counter 10 performs the operation of increasing the logic values of the count signals D<0:3> as illustrated in FIG. 3, output signals of the first and second latches LT1 and LT2 of the first to fourth flip-flops DFF0 to DFF3 may be toggled. The toggling serves as a main factor of power consumption.

SUMMARY

Various embodiments are directed to a digital counter capable of reducing power consumption.

In an embodiment of the present invention, a digital counter includes: a plurality of flip-flops configured to generate a plurality of count signals; and a controller configured to prevent level transition of an input terminal of a flip-flop to generate a count signal corresponding to a least significant bit (LSB) in response to a clock signal and a count end signal.

The flip-flop to generate the LSB count signal may include: a first latch configured to latch an input signal received through the input terminal and maintain an internal node to the level of the input signal; and a second latch configured to latch the level of the internal node and maintain a level of an output terminal.

While the count end signal is deactivated, toggling operations of the first and second latches may be blocked by the controller.

In an embodiment of the present invention, a digital counter includes: a controller configured to combine a clock signal and a count end signal and generate a first control signal and a second control signal; a first flip-flop having an input terminal configured to receive the first control signal; a second flip-flop having a clock terminal configured to receive the clock signal; and a multiplexer configured to couple an output terminal or inverting output terminal to an input terminal of the second flip-flop.

In an embodiment of the present invention, a digital counter includes: a controller configured to prevent a clock signal from being applied to an input terminal of a flip-flop to generate a least significant (LSB) count signal when a count end signal is configured to a low level.

BRIEF DESCRIPTION OF THE DRAWINGS

Features, aspects, and embodiments are described in conjunction with the attached drawings, in which:

FIG. 9 is a table comparing the toggling numbers and power consumptions of various types of counters.

DETAILED DESCRIPTION

Hereinafter, a digital counter according to the present invention will be described below with reference to the accompanying drawings through various embodiments.

Figure 4:
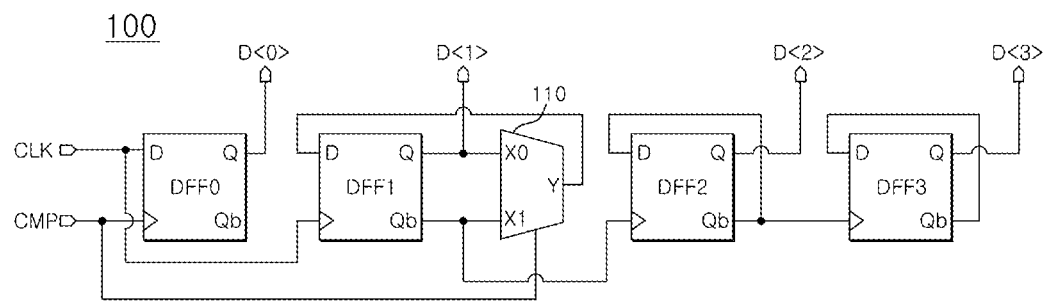
FIG. 4 is a circuit diagram of a digital counter 100 according to an embodiment of the present invention.

FIG. 4 is a circuit diagram of a digital counter 100 according to an embodiment of the present invention.

FIG. 4 illustrates a four-bit digital counter. The digital counter 100 according to an embodiment of the present invention may include first to fourth flip-flops DFF0 to DFF3 and a multiplexer 110.

The first flip-flop DFF0 may have an input terminal D configured to receive a clock signal CLK and a clock terminal configured to a count end signal CMP.

The second flip-flop DFF1 may have a clock terminal configured to receive the clock signal CLK.

The multiplexer 110 may be configured to input a signal inputted through a first input terminal X0 or a signal inputted through a second input terminal X1 to the input terminal D of the second flip-flop DFF1 through an output terminal Y in response to the count end signal CMP.

At this time, an output terminal Q and an inverting output terminal Qb of the second flip-flop DFF1 may be coupled to the first and second input terminals X0 and X1 of the multiplexer 110, is respectively.

When the count end signal CMP is deactivated to a low level, the multiplexer 110 may select the second input terminal X1, and when the count end signal CMP is activated to a high level, the multiplexer 110 may select the first input terminal X0 to output a signal through the output terminal Y.

At this time, the count end signal CMP may be provided from a controller (not illustrated) of a system having the digital counter 100 installed therein.

While the count end signal CMP is deactivated, the digital counter 100 may perform a normal counting operation, and when the count end signal CMP is activated, the counting operation of the digital counter 100 may end.

Each of the third and fourth flip-flops DFF2 and DFF3 may have an inverting output terminal Qb coupled to an input terminal D thereof.

Each of the third and fourth flip-flops DFF2 and DFF3 may have a clock terminal coupled to the inverting output terminal Qb of the previous flip-flop.

The first to fourth flip-flops DFF0 to DFF3 output signals of the respective output terminals as count signals D<0:3>.

Figure 5:
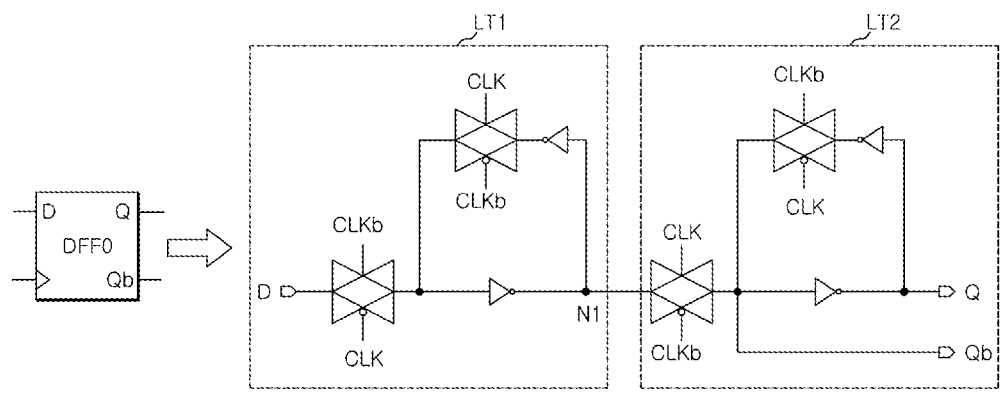
FIG. 5 is a circuit diagram illustrating the internal configuration of a first flip-flop DFF0 of FIG. 4.

FIG. 5 is a circuit diagram illustrating the internal configuration of the first flip-flop DFF0 of FIG. 4.

Referring to FIG. 5, the first flip-flop DFF0 may include a first latch LT1 and a second LT2 and also receive a clock signal CLKb.

The first latch LT1 may be configured to latch a signal inputted through the input terminal D and maintain a node N1 to the level of the signal inputted through the input terminal D, and may include a plurality of transmission gates and a plurality of inverters.

The second latch LT2 may be configured to latch the level of the node N1 and maintain the levels of the output terminal Q and the inverting output terminal Qb, and may include a plurality of transmission gates and a plurality of inverters.

At this time, the second to fourth flip-flops DFF1 to DFF3 may be configured in the same manner as the first flip-flop DFF0.

Figure 6:
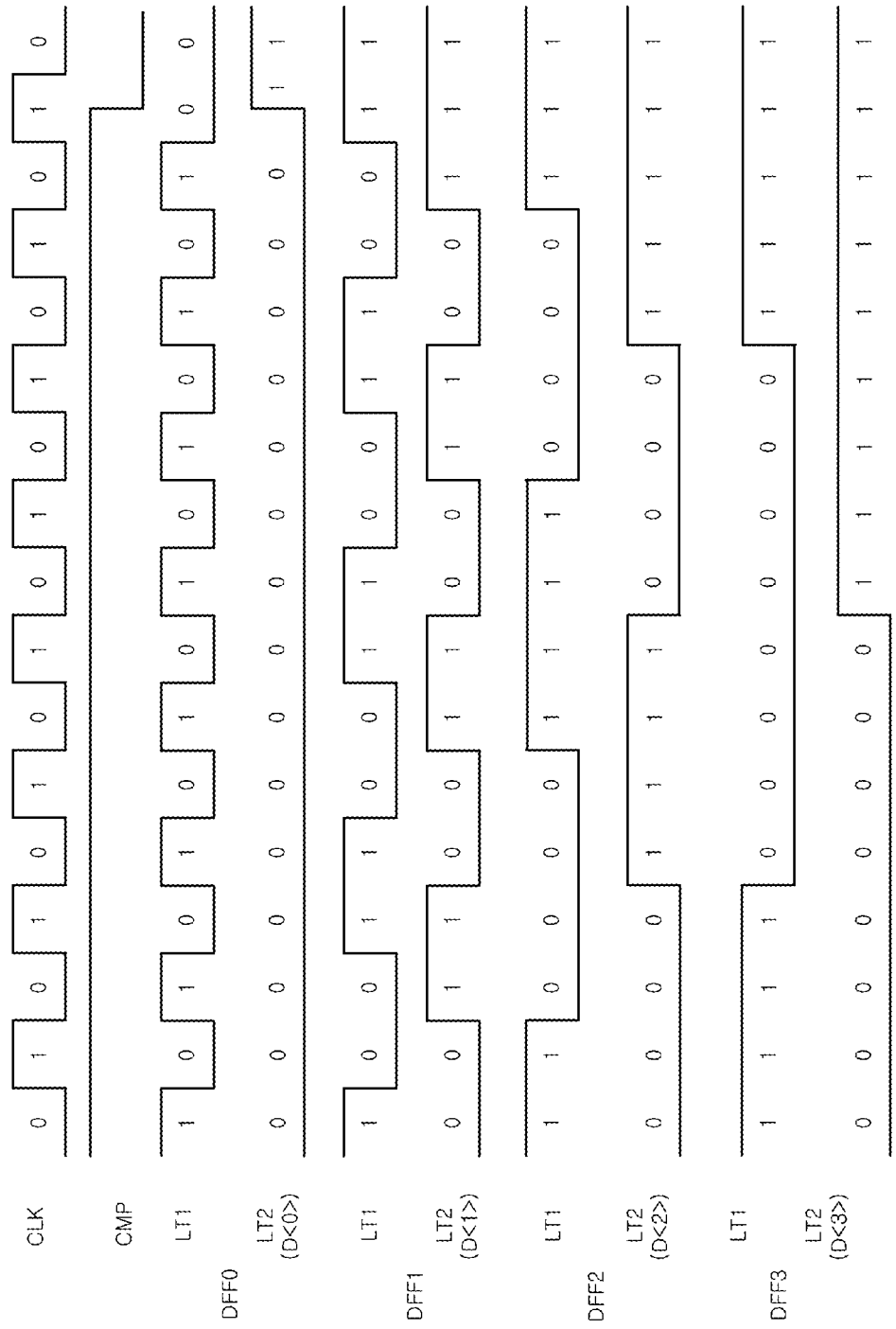
FIG. 6 is an operation timing diagram of FIG. 4.

FIG. 6 is an operation timing diagram of FIG. 4.

When the count end signal CMP is at a low level, the count signal D<0> of the first flip-flop DFF0 may be maintained at a constant value, that is, a low level.

Since the count end signal CMP is at a low level, the multiplexer 110 may couple the inverting output terminal Qb of the second flip-flop DFF1 to the input terminal D of the second flip-flop DFF1.

The second flip-flop DFF1 may toggle the count signal D<1> whenever a falling edge of the clock signal CLK occurs.

The third flip-flop DFF2 may toggle the count signal D<2> whenever a falling edge of the output signal of the inverting output terminal Qb of the second flip-flop DFF1 occurs.

The fourth flip-flop DFF3 may toggle the count signal D<3> whenever a falling edge of the output signal of the inverting output terminal Qb of the third flip-flop DFF2 occurs.

Then, as the count end signal CMP changes to a high level, the output signal of the output terminal Q of the second flip-flop DFF1, that is, the count signal D<1> may be stopped from toggling, and maintained at the current level.

Since the count end signal CMP is at a high level, the multiplexer 110 may couple the output terminal Q of the second flip-flop DFF1 to the input terminal D of the second flip-flop DFF1.

As the output terminal Q of the second flip-flop DFF1 is stopped from toggling, the output terminals Q of the third and fourth flip-flops DFF2 and DFF3 may also be stopped from toggling.

Figure 3:
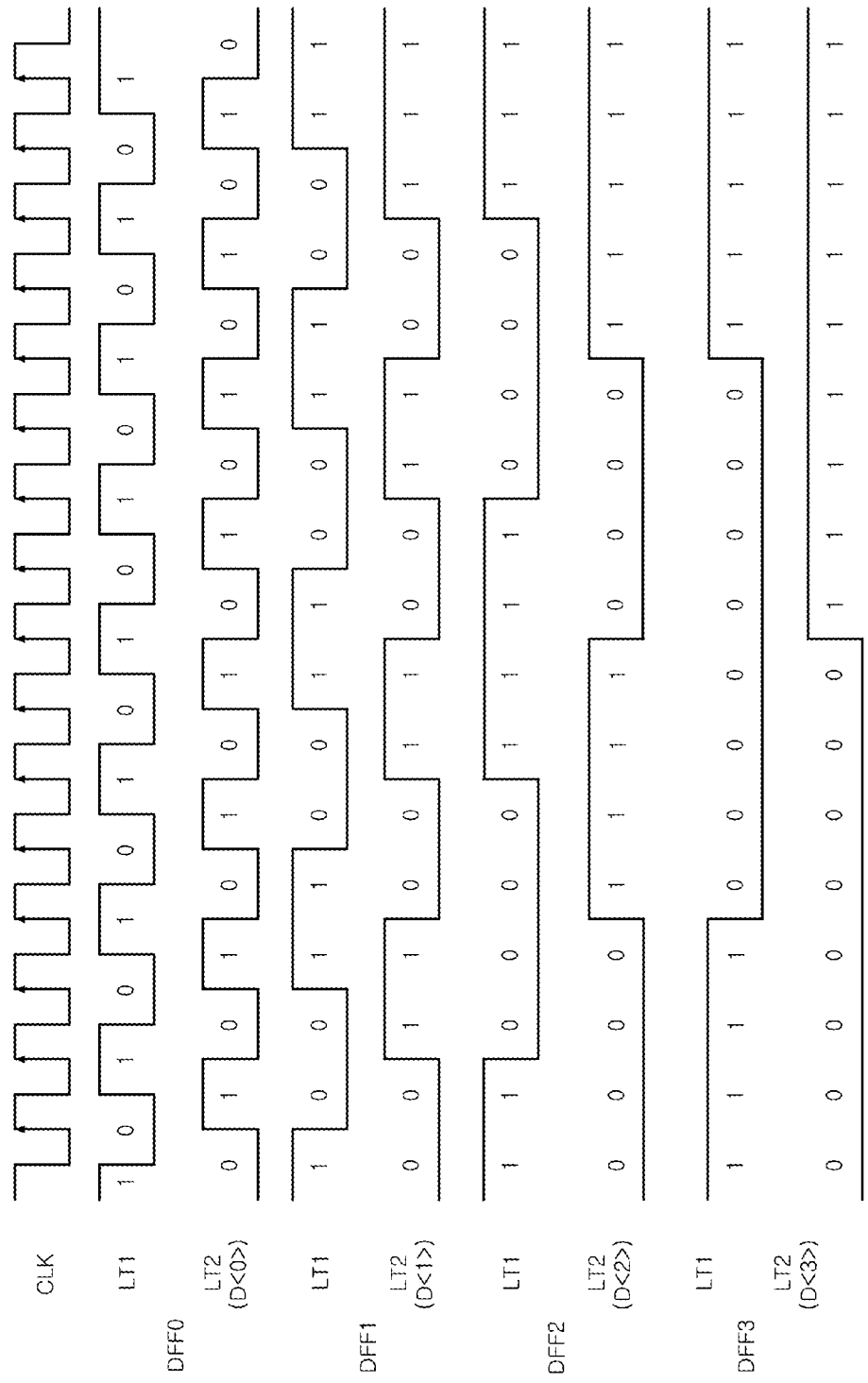
FIG. 3 is an operation timing diagram of FIG. 1.

At this time, referring to FIG. 6, it can be seen that the toggling number of the count signal D<0> at the least significant bit (LSB), which is larger than the toggling numbers of the count signals D<1:3> at high bits, is reduced in comparison to the conventional digital counter based on FIG. 3. Thus, the digital counter according to the embodiment of the present invention may reduce power consumption.

Figure 7:
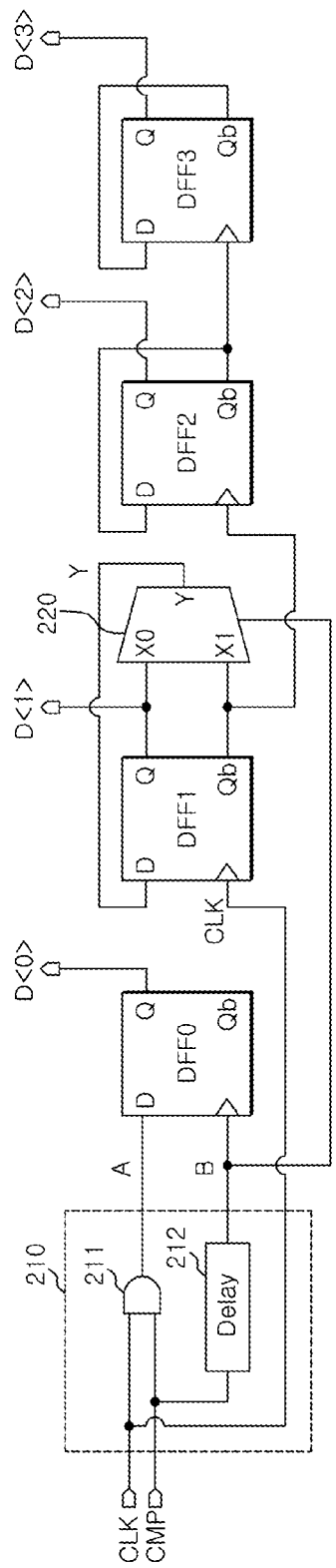
FIG. 7 is a circuit diagram of a digital counter 200 according to an embodiment of the present invention.

FIG. 7 is a circuit diagram of a digital counter 200 according to an embodiment of the present invention.

FIG. 7 illustrates a four-bit digital counter. The digital counter 200 according to an embodiment of the present invention may include a controller 210, first to fourth flip-flops DFF0 to DFF3 and a multiplexer 220.

The controller 210 may be configured to prevent level transition of an input terminal D of the first flip-flop DFF0 to generate a count signal D<0> corresponding to the LSB, in response to a clock signal CLK and a count end signal CMP.

The controller 210 may be configured to prevent the clock signal CLK from being applied to the input terminal D of the first flip-flop DFF0 to generate the LSB count signal D<0> while the count end signal CMP is deactivated to a low level.

The controller 210 may include a logic gate 211 and a delay 212.

The logic gate 211 may be configured to perform an AND operation on the clock signal CLK and the count end signal CMP and generate a first control signal A.

The delay 212 may be configured to generate a setup timing margin of the first flip-flop DFF0 according to activation of the count end signal CMP.

The delay 212 may be configured to delay the count end signal CMP by a predetermined time and output the delayed signal as a second control signal B.

The first flip-flop DFF0 may have an input terminal D configured to receive the first control signal A and a clock terminal configured to receive the second control signal B.

The second flip-flop DFF1 may have a clock terminal configured to receive the clock signal CLK.

The multiplexer 220 may be configured to stop count operations of the second to fourth flip-flops DFF1 to DFF3 in response to the delayed count end signal CMP, that is, the second control signal B.

The multiplexer 220 may input a signal C inputted through a first input terminal X0 or a signal D<1> inputted through a second input terminal X1 to the input terminal D of the second flip-flop DFF1 through an output terminal Y in response to the second control signal B.

At this time, an output terminal Q and inverting output terminal Qb of the second flip-flop DFF1 may be coupled to the first and second input terminals X0 and X1 of the multiplexer 220, respectively.

When the second control signal B is deactivated to a low level, the multiplexer 220 may select the second input terminal X1, and when the second control signal B is activated to a high level, the multiplexer 220 may select the first input terminal X0 to output the signal through the output terminal Y.

At this time, the count end signal CMP may be provided from a controller (not illustrated) of a system having the digital counter 100 installed therein.

While the count end signal CMP is deactivated, the digital counter 100 may perform a normal counting operation, and as the count end signal CMP is activated, the counting operation of the digital counter 100 may end.

Each of the third and fourth flip-flops DFF2 and DFF3 may have an inverting output terminal Qb coupled to an input terminal D thereof.

Each of the third and fourth flip-flops DFF2 and DFF3 may have a clock terminal coupled to the inverting output terminal of the previous flip-flop.

The first to fourth flip-flops DFF0 to DFF3 may output signals of the respective output terminals Q as count signals D<0:3>.

The first to fourth flip-flops DFF0 to DFF3 may be configured in the same manner as illustrated in FIG. 5.

Figure 8:
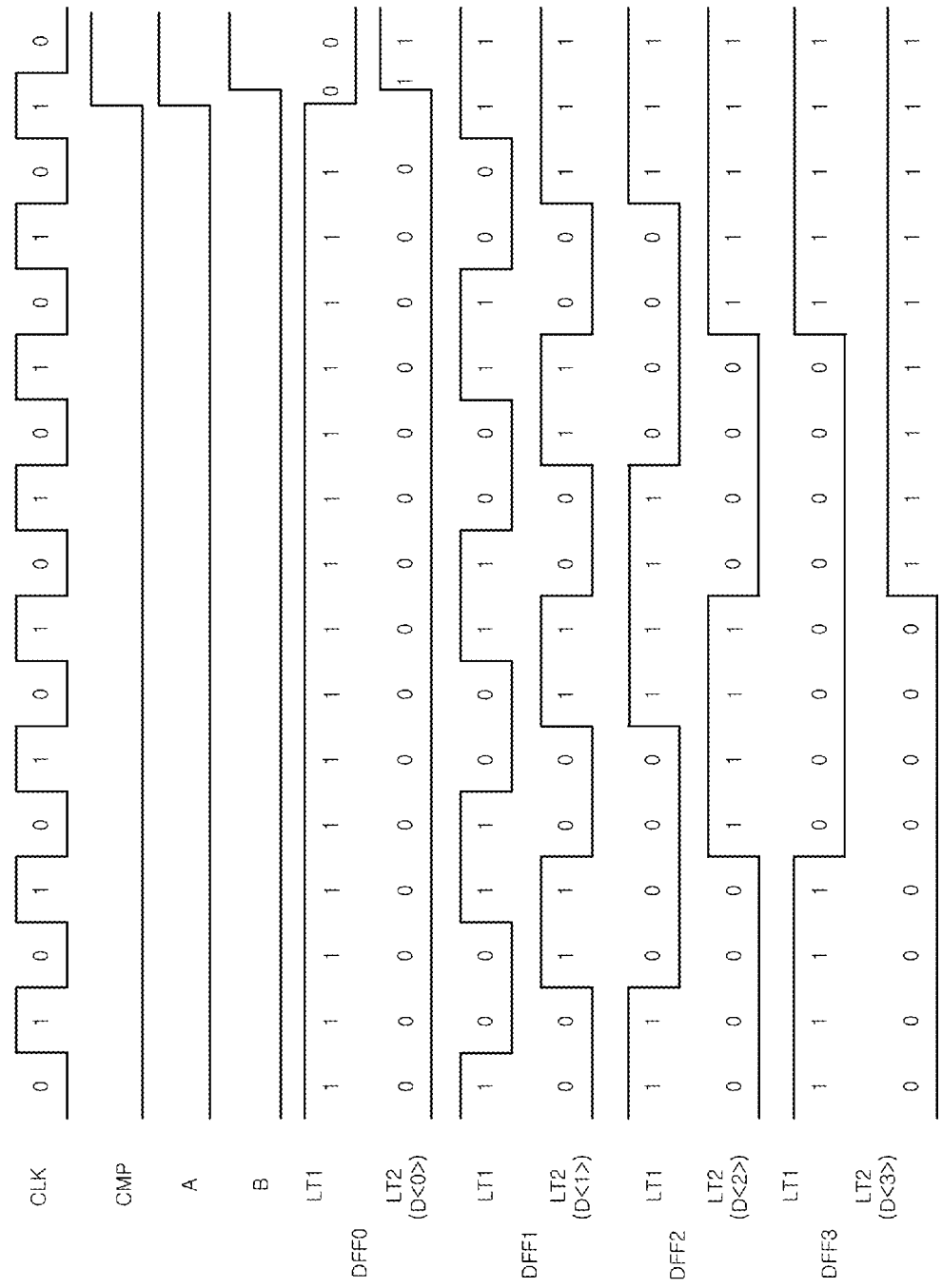
FIG. 8 is an operation timing diagram of FIG. 7.

FIG. 8 is an operation timing diagram of FIG. 7.

When the count end signal CMP is at a low level, the first control signal A and the second control signal B may be maintained at a low level.

Thus, the count signal D<0> of the first flip-flop DFF0 is maintained at a constant value, that is, a low level.

Since the second control signal B is at a low level, the multiplexer 110 may couple the inverting output terminal Qb of the second flip-flop DFF1 to the input terminal D of the second flip-flop DFF1.

The second flip-flop DFF1 may toggle the count signal D<1> whenever a falling edge of the clock signal CLK occurs.

The third flip-flop DFF2 may toggle the count signal D<2> whenever a falling edge of the output signal of the inverting output terminal Qb of the second flip-flop DFF1 occurs.

The fourth flip-flop DFF3 may toggle the count signal D<3> whenever a falling edge of the output signal of the inverting output terminal Qb of the third flip-flop DFF2 occurs.

Referring to FIG. 5, while the count end signal CMP maintains a low level, that is, while a normal counting operation is performed, the output signal D<0> of the second latch LT2 of the first flip-flop DFF0 to generate the LSB count signal D<0> may not only be prevented from toggling, but the output node n1 of the first latch LT1 may also be prevented from toggling.

Then, as the count end signal CMP changes to a high level, the clock signal CLK may be provided as the first control signal A to the input terminal D of the first flip-flop DFF0.

Thus, the count signal D<0> of the first flip-flop DFF0 may be toggled and maintained to a high level.

After a predetermined delay time, the multiplexer 110 may couple the output terminal Q of the second flip-flop DFF1 to the input terminal D of the second flip-flop DFF1 according to the high-level second control signal B.

Thus, the count signal D<1> of the second flip-flop DFF1 may be maintained at a constant value, that is, a high level regardless of the clock signal CLK.

As the count signal D<1> is maintained at a high level, the third and fourth flip-flops DFF2 and DFF3 may be stopped from toggling, and the count signals D<2:3> are maintained at a high level.

At this time, referring to FIG. 8, it can be seen that the toggling number of the internal signal as well as the output signal of the first flip-flop DFF0 to generate the LSB count signal D<0> having a larger toggling number than the high-bit count signals D<1:3> may be reduced in comparison to the conventional digital counter. Thus, the digital counter may reduce the power consumption.

FIG. 9 is a table comparing the toggling numbers and power consumptions of various types of counters.

Figure 1:
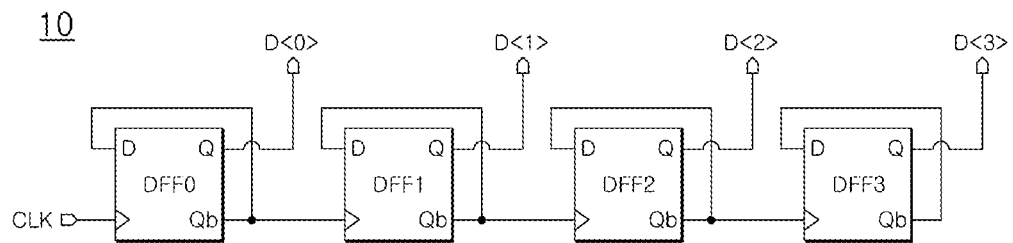
FIG. 1 is a circuit diagram of a conventional digital counter 10.
Figure 2:
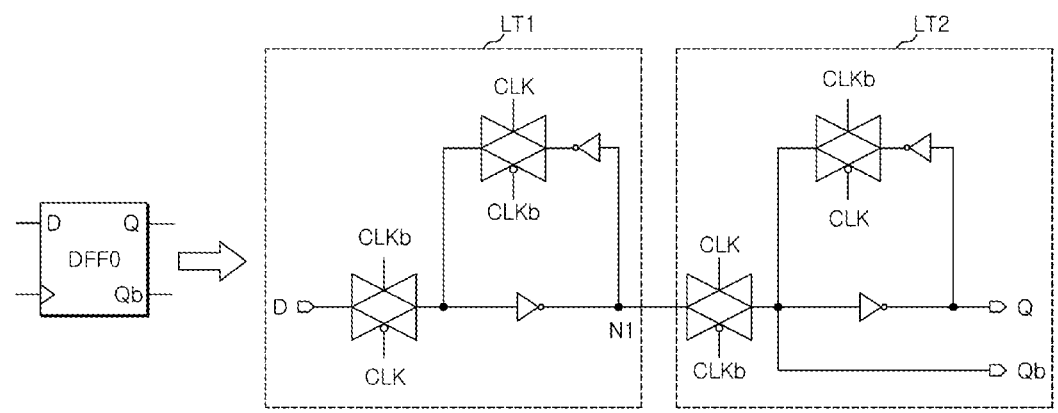
FIG. 2 is a circuit diagram illustrating the internal configuration of a first flip-flop DFF0 of FIG. 1.

FIG. 9 comparatively shows the toggling numbers of the 10-bit digital counters based on FIGS. 1, 4, and 7. FIG. 9 also illustrates flip-flops DFF0 to DFF9.

Referring to FIG. 9, the toggling number of the flip-flop based on FIG. 1 among the flip-flops DFF0 in charge of the LSB is 1025, but the toggling number of the flip-flop based on FIG. 4 may be reduced to 513 and the toggling number of the flip-flop based on FIG. 7 may be reduced to 1.

Thus, while the toggling number of the overall flip-flops based on FIG. 1 is 2056, the toggling number of the overall flip-flops based on FIG. 4 may be reduced to 1544, and the toggling number of the overall flip-flops based on FIG. 7 may be reduced to 1033.

That is, when the power consumption of the digital counter 10 of FIG. 1 is set to 100%, the power consumption of the digital counter 100 of FIG. 4 may be reduced to 75.5%, and the power consumption of the digital counter 200 of FIG. 7 may be reduced to 50.2%.

According to an embodiment of the present invention, it is possible to reduce power consumption of the digital counter.

While certain embodiments have been described above, it will be understood to those skilled in the art that various embodiments described are by way of example only. Accordingly, the digital counter described herein should not be limited based on the described embodiments. Rather, the digital counter described herein should only be limited in light of the claims that follow when taken in conjunction with the above description and accompanying drawings.

What is claimed is:

1. A digital counter comprising:
   a plurality of flip-flops configured to generate a plurality of count signals; and
   a controller configured to prevent level transition of an input terminal of a flip-flop to generate a count signal corresponding to a least significant bit (LSB), in response to a clock signal and a count end signal during a counting operation of the digital counter; and
   a multiplexer configured to stop count operations of the other flip-flops excluding the flip-flop to generate the LSB count signal, in response to the count end signal,
   wherein the counting operation of the digital counter stops when the count end signal is activated.

2. The digital counter according to claim 1, wherein each of the other flip-flops excluding the flip-flop to generate the LSB count signal among the plurality of flip-flops has a clock terminal coupled to an inverting output terminal of the previous flip-flop.

3. The digital counter according to claim 1, wherein each of the other flip-flops excluding the flip-flop to generate the LSB count signal among the plurality of flip-flops has an input terminal coupled to an inverting output terminal thereof.

4. The digital counter according to claim 1, wherein the controller is configured to prevent the clock signal from being applied to the input terminal of the flip-flop to generate the LSB count signal while the count end signal is deactivated.

5. The digital counter according to claim 1, wherein the controller comprises:
   a logic gate configured to combine the clock signal and the count end signal and provide the combined signal to the input terminal of the flip-flop to generate the LSB count signal; and
   a delay configured to delay the count end signal by a predetermined time and output the delayed signal.

6. The digital counter according to claim 1, wherein the multiplexer is configured to stop the count operation of the next flip-flop to the flip-flop to generate the LSB count signal in response to activation of the count end signal.

7. The digital counter according to claim 1, wherein the flip-flop to generate the LSB count signal comprises:
   a first latch configured to latch an input signal received through the input terminal and maintain an internal node to the level of the input signal; and
   a second latch configured to latch the level of the internal node and maintain a level of an output terminal.

8. The digital counter according to claim 7, wherein while the count end signal is deactivated, toggling operations of the first and second latches are blocked by the controller.

9. A digital counter comprising:
   a controller configured to combine a clock signal and a count end signal and generate a first control signal and a second control signal;
   a first flip-flop having an input terminal configured to receive the first control signal;
   a second flip-flop having a clock terminal configured to receive the clock signal; and
   a multiplexer configured to couple an output terminal or inverting output terminal to an input terminal of the second flip-flop.

10. The digital counter according to claim 9, further comprising a third flip-flop having a clock terminal coupled to the inverting output terminal of the second flip-flop.

11. The digital counter according to claim 9, wherein the controller is configured to delay the count end signal by a predetermined time and generate the second control signal.

12. The digital counter according to claim 9, wherein the first flip-flop has a clock terminal configured to receive the second control signal.

13. The digital counter according to claim 10, wherein the third flip-flop has an input terminal coupled to an inverting output terminal thereof.

14. The digital counter according to claim 9, wherein the first flip-flop comprises:
   a first latch configured to latch an input signal received through the input terminal and maintain an internal node to the level of the input signal; and
   a second latch configured to latch the level of the internal node and maintain a level of an output terminal.

15. The digital counter according to claim 14, wherein while the count end signal is deactivated, toggling operations of the first and second latches are blocked by the controller.

16. A digital counter comprising:
   a controller configured to prevent a clock signal from being applied to an input terminal of a first flip-flop to generate a least significant bit (LSB) count signal when a count end signal is configured to a low level during a counting operation of the digital counter; and
   a multiplexer configured to input a signal through a first input terminal to an input terminal of a second flip flop, wherein the counting operation of the digital counter stops when the count end signal is activated.

17. The digital counter according to claim 16, wherein the controller comprises:
   a logic gate configured to perform an operation on the clock signal and the count end signal to generate a first control signal; and
   a delay configured to generate a second control signal by delaying the count end signal by a predetermined time.

18. The digital counter of claim 17, wherein the first control signal and the second control signal are configured at the low level and the count signal of the first flip-flop is configured at a constant value.

19. The digital counter of claim 17, wherein the second flip-flop toggles the count signal at a period when a falling edge of the clock signal occurs.

20. The digital counter of claim 17, wherein during a counting operation, an output signal and an output node of the first flip-flop are prevented from toggling.

21. The digital counter of claim 17, wherein the multiplexer couples an output terminal of the second flip-flop to the input terminal of the second flip-flop.

22. The digital counter of claim 21, wherein the count signal of the second flip-flop is maintained at a high level to prevent a third flip-flop and a fourth flip-flop from toggling.

* * * * *